United States Patent [19]

Yoshikawa

[11] Patent Number: 5,159,431
[45] Date of Patent: Oct. 27, 1992

[54] NONVOLATILE SEMICONDUCTOR DEVICE WITH A TRENCH ISOLATOR

[75] Inventor: Kuniyoshi Yoshikawa, Tokyo, Japan

[73] Assignee: Kabushiki Kaisha Toshiba, Kawasaki, Japan

[21] Appl. No.: 654,687

[22] Filed: Feb. 13, 1991

Related U.S. Application Data

[62] Division of Ser. No. 433,592, Jul. 18, 1990, Pat. No. 5,015,601.

[30] Foreign Application Priority Data

Jul. 25, 1989 [JP] Japan .................. 1-191839

[51] Int. Cl.⁵ .................. H01L 29/34; H01L 29/10; H01L 29/68; H01L 29/92
[52] U.S. Cl. .................. 357/54; 357/23.3; 357/23.5; 357/23.14
[58] Field of Search .................. 357/23.3, 23.5, 23.14, 357/54

[56] References Cited

U.S. PATENT DOCUMENTS

| | | | |
|---|---|---|---|
| 4,326,331 | 4/1982 | Guterman | 357/23.5 |
| 4,455,740 | 6/1984 | Iwai | 357/55 |
| 4,698,900 | 10/1987 | Esquivel | 357/41 |
| 4,855,800 | 8/1989 | Esquivel et al. | 357/23.5 |
| 4,951,103 | 8/1990 | Esquivel et al. | 357/23.14 |
| 4,979,004 | 12/1990 | Esquivel et al. | 357/23.5 |

FOREIGN PATENT DOCUMENTS

| | | |
|---|---|---|
| 0284065 | 9/1988 | European Pat. Off. |
| 61-214446 | 9/1986 | Japan |
| 62-88369 | 4/1987 | Japan |
| 63-86560 | 1/1988 | Japan |
| 63-168053 | 3/1988 | Japan |

OTHER PUBLICATIONS

IEDM Technical Digest, 1986; "High Density Contactless, Self-Aligned EPROM Cell Array Technology", Equivel et al., pp. 592–595.

IEEE International Solid-State Circuits Conference, 1987; "Nonvolatile Memory-A 1Mb CMOS EPROM with a 13.5 $\mu m^2$ Cell", Coffman et al., pp. 72, 73 and 343.

Symposium On VLSI Technology Digest of Technical Papers, May 21, 1987; "Shallow Trench Isolated Buried N+ FAMOS Transistors For VLSI EPROMs", Esquivel et al., pp. 105 and 106.

IEDM Technical Digest, 1987; "A New Self-Aligned Planar Array Cell For Ultra High Density EPROMs", Mitchell et al., pp. 548–551.

Primary Examiner—Andrew J. James
Assistant Examiner—Daniel N. Russell
Attorney, Agent, or Firm—Finnegan, Henderson, Farabow, Garrett and Dunner

[57] ABSTRACT

A source diffusion region and a drain diffusion region are formed under an insulation film which is thicker than a gate insulation film and which isolates the adjacent channel regions from each other. The adjacent source and drain diffusion regions are isolated from each other by a trench which extends from the central portion of the thick insulation film to the interior of a semiconductor substrate. The trench is formed in a self-alignment manner with reference to the end portions of the adjacent floating gate electrodes, and the depth of this trench is determined so that the adjacent source and drain diffusion regions can be spaced sufficiently apart from each other. Since the trench reliably prevents punch-through and current leakage to the adjacent element, it is possible to remarkably reduce the cell size. Moreover, the peripheral circuits are not complicated since the functions of the source and drain regions are fixed.

9 Claims, 4 Drawing Sheets

NONVOLATILE SEMICONDUCTOR DEVICE WITH A TRENCH ISOLATOR

This is a division of application Ser. No. 07/553,592, filed Jul. 18, 1990 now U.S. Pat. No. 5,015,601.

BACKGROUND OF THE INVENTION

1. Field of the Invention

The present invention relates to a reprogrammable nonvolatile semiconductor device which has a gate electrode structure comprised of at least two layers and a method of manufacturing the same, and more particularly to a nonvolatile memory such as an EPROM.

2. Description of the Related Art

FIG. 1 is a view showing the planar pattern of a conventional ultraviolet erasure type EPROM which has e.g. a double-layered gate electrode structure, FIG. 2 is a sectional view taken along line II—II in FIG. 1, and FIG. 3 is a circuit diagram corresponding to the EPROM shown in FIGS. 1 and 2. Referring to FIGS. 1 and 2, reference numeral 1 denotes a memory cell, 2 an element isolation region, 3 a floating gate electrode, 4 a control gate electrode serving as a word line, 5 a contact hole, 6 a bit line formed of aluminum, 10 a p-type substrate, 11 an n+-type source, 12 an n+-type drain. and 13 an insulating BPSG layer. The floating gate electrode 3 and the control gate electrode 4 jointly constitute a double-layered gate electrode structure. The n+-type source 11 and the n+-type drain 12 are a common source and a drain, respectively, which are used in common to adjacent memory cells. The common source 11 is diffusion layer which is formed in a surface region of the p+-type substrate 10 in parallel to the control gate electrode 4. The contact hole 5 is used in common to the adjacent memory cells. To write information in the memory cell, a high voltage is applied to the control gate electrode 4 and the drain 12. To be more specific, channel not electrons are generated by the application of the high voltage, and electrons are injected into the floating gate electrode 3. As a result, the threshold voltage of the cell transistor is raised, thus allowing the information to be written in the memory cell.

In the memory mentioned above, the contact hole 5 and the element isolation region 2 have to be spaced apart from each other by a certain distance (an allowance for misalignment) which is required in the masking step of the manufacture. Likewise, the contact hole 5 and the floating gate electrode 3 have to be spaced apart from each other by a certain distance. Due to the necessity of providing such allowances, the contact hole 5 cannot be scaled or reduced proportionally. Thus, each memory cell is prevented from being miniaturized or having a large capacity. In addition, one half of a common source diffusion layer has to be assigned to each memory cell.

FIG. 4 is a sectional view showing the structure of a conventional contactless EPROM, and FIG. 5 is a circuit diagram of the contactless EPROM. Referring to FIGS. 4 and 5, reference numeral 21 denotes a p-type substrate, 22 a bit line formed by an n+-type embedded diffusion layer (i.e., a source/drain diffusion layer), 23 a field insulation film (i.e., an element-isolation oxide film), 24 a gate insulation film, 25 an insulation film between a floating gate and a control gate, 26 a floating gate, 27 a control gate serving as a word line, and 28 a memory cell. In order to provide a large capacity for this contactless EPROM, the source/drain diffusion layer 22 is buried under the field insulation film 23 located between the adjacent memory cells which use the control gate 27 in common. No contact hole is provided for the buried diffusion layer 22. Due to this cell structure, the EPROM does not have to have a contact hole or a common source diffusion layer, such as that shown in FIG. 3, so the EPROM can be miniaturized and have a large capacity. The cell size of the contactless EPROM shown in FIG. 4 is not more than 70% of the cell size of the conventional EPROM. However, this contactless EPROM has to be provided with a selection circuit (not shown) by which the buried diffusion layer 22 is selectively used as either a source or a drain in accordance with the operating condition of each memory cell. Thus, the contactless EPROM is disadvantageous, in that the peripheral circuit portions (i.e., the circuit portions other than each memory cell) are inevitably complicated. In addition, the more the EPROM is miniaturized, the worse the selection characteristic of the selection circuit becomes.

SUMMARY OF THE INVENTION

The present invention has been developed in consideration of the above circumstances, and one object of the present invention is to provide a nonvolatile semiconductor device which has a similar array circuit to that of a conventional EPROM and which can be miniaturized and have a large capacity.

To achieve the first object, the present invention provides a nonvolatile semiconductor device made up of a plurality of semiconductor elements, each of which comprises: a semiconductor substrate of a first conductivity type; a source region and a drain region which are formed in a surface region of the semiconductor substrate and have a second conductivity type; a first gate electrode formed above a channel region between the source and drain regions and kept in an electrically-floating state by a first gate insulation film; and a second gate electrode serving as a control gate and formed above the first gate electrode, with a second gate insulation film interposed, the source and drain regions being formed under a third insulation film which is thicker than the first gate insulation film and which isolates the channel region of one semiconductor element from that of an adjacent one, and the source and drain regions being located under the third insulation film and separated from each other at a position corresponding to an end portion of the first gate electrode.

In the present invention, the trench is formed substantially in self-alignment with reference to end portions of two floating gate electrodes, and its depth is so determined as to sufficiently isolate the adjacent source and drain diffusion regions from each other. Since the trench reliably prevents punch-through and current leakage to the adjacent element, it is possible to remarkably reduce the cell size of the nonvolatile memory. Moreover, the peripheral circuits can be simple since the source and drain regions are provided individually.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will now be described, with reference to the accompanying drawings.

Figure 6:
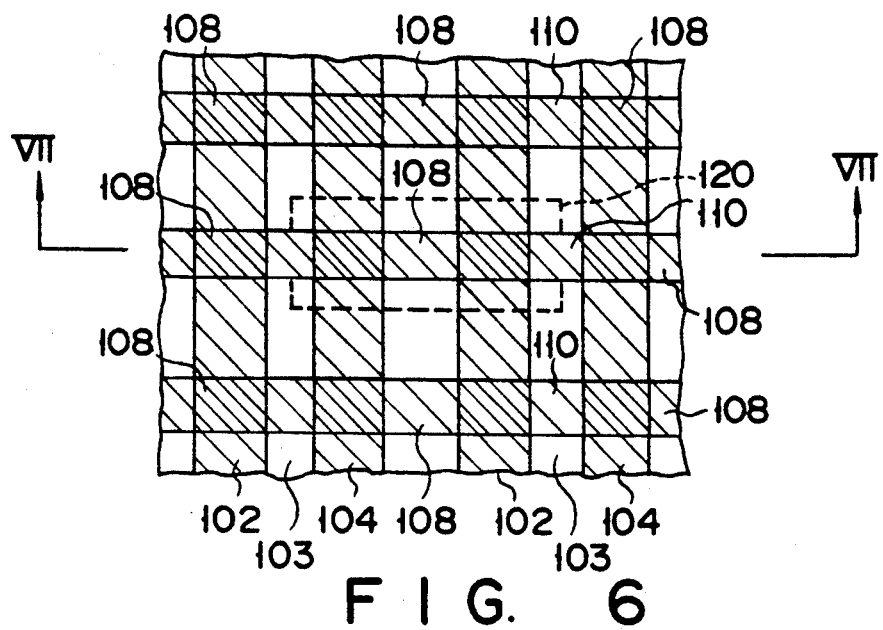
FIG. 6 is a view showing the planar pattern of a nonvolatile semiconductor device according to one embodiment of the present invention.
Figure 7:
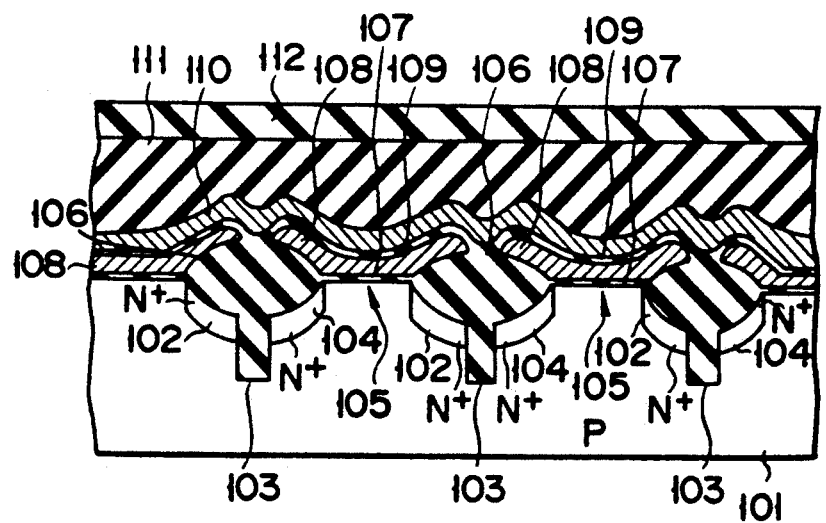
FIG. 7 is a sectional view of the nonvolatile semiconductor device shown in FIG. 6, the sectional view being taken along line VII—VII in FIG. 6.

FIG. 6 shows a planar pattern of a nonvolatile semiconductor device according to one embodiment of the present invention, and FIG. 7 is a sectional view taken along line VII—VII in FIG. 6. In the nonvolatile semiconductor device of the embodiment, n+-type drain diffusion layers 102 and n+-type source diffusion layers 104 are formed in a surface region of a p-type silicon substrate 101 such that a trench 103 is located between one drain diffusion layer 102 and its corresponding source diffusion layer 104. A channel region 105 is provided between one drain layer 102 and its adjacent source diffusion layer 104, and is overlaid with a first gate insulation film 107. A floating gate electrode 108 (i.e., a first gate electrode) is formed on the first gate insulation film 107, and is overlaid with a second gate insulation film 109. A field oxide film 106 isolates the adjacent floating gate electrodes 108 from each other. The drain diffusion layer 102 of one cell and the source diffusion layer 104 of the adjacent cell are located under the same field oxide film 106, and are isolated from each other by the trench 103, which is located under the substantially central portion of the field oxide film 106. A control gate electrode 110 (i.e., a second gate electrode) is formed to cover the second gate insulation film 109. The control gate electrode 110 is located above the floating gate electrode 108 and extends above the field oxide film 106 and the trench 103. A CVD oxide film 111 is formed over the resultant semiconductor structure to cover the above-mentioned structural components. Further, a BPSG film 112 is formed on the entire surface of the CVD oxide film 111. The floating gate electrode 108 and the control gate electrode 110 are arranged perpendicular to both the n+-type drain diffusion layer 102 and the n+-type source diffusion layer 104. Reference numeral 120 denotes a memory cell.

The method of manufacturing the above nonvolatile semiconductor device will now be described with reference to FIGS. 8A to 8F.

Figure 8A:
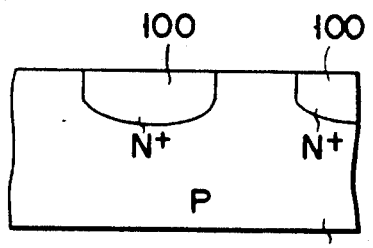
FIGS. 8A to 8F illustrate the processes in which the nonvolatile semiconductor device shown in FIG. 6 are manufactured.

First, as is shown in FIG. 8A, an n+-type embedded layer 100 is formed in selected surface regions of the p-type silicon substrate 101 of single-crystal silicon by use of lithography and ion-implantation. In the ion implantation, arsenic (As) and antimony (Sb) are used, for example. The n+-type embedded layer 100 serves as a source/drain diffusion layer.

Figure 8B:
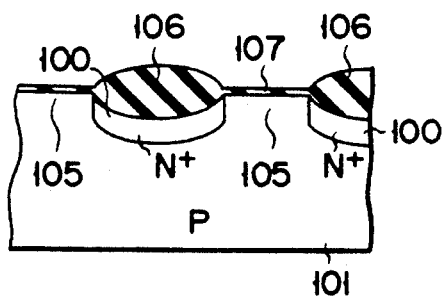

Next, as is shown in FIG. 8B, a field oxide film 106 of $SiO_2$ and a first gate insulating film 107 of $SiO_2$ are formed on the n+-type embedded layer 100 and the p-type silicon substrate 101, respectively. The oxide film 106 on the n+-type embedded layer 100 is grown sufficiently thicker than the oxide film 107 on the p-type silicon substrate 101 thereby to thereby isolate the adjacent memory cells from each other. At that time, the channel portion of $SiO_2$ can be removed with the location of the field oxide film 106 being masked and thereafter a first gate insulation layer 107 of $SiO_2$ can be formed on the semiconductor structure. Channel ions, e.g. boron (B) ions, are implanted into that portion of the substrate 101 which is located between the adjacent n+-type embedded layers 100, to thereby form a channel region 105.

Figure 8C:
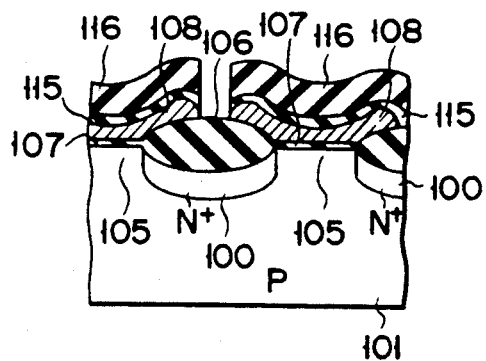

Then, as is shown in FIG. 8C, stacked layers made of a first polysilicon layer and a protection oxide film 115, having a predetermined thickness and a predetermined width, are deposited on the whole surface of the semiconductor structure by use of a CVD process. The polysilicon layers on trench formation areas in the central portions of the field oxide films 106 are selectively removed by using the mask alignment process, to thus form floating gate electrodes 108. The floating gate electrode 108 is kept in an electrically floating condition with reference to the channel region 105 by the first gate insulation layer 107, and extends perpendicular to the n+-type source/drain diffusion layer 100.

Figure 8D:
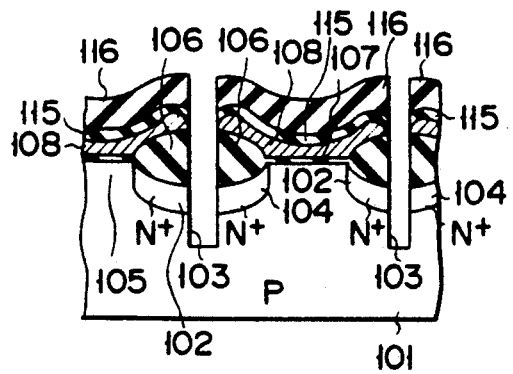

Thereafter, as is shown in FIG. 8D, a trench 103 is formed by etching, using the floating gate polysilicon, the protection oxide film 115 and the resist 116 as masks such that the trench 103 extends through portions of the field oxide film 106 and the n+-type embedded layer 100 and reaches the interior of the p-type silicon substrate 101. This trench 103 can be formed in a self-alignment fashion with reference to the end portions of the adjacent floating gate electrodes 108. To be more specific, the floating gate electrode 108 (i.e., the first polysilicon layer) is first formed, and then the field oxide film 106 and the n+-type embedded layer 100 are partly removed by etching, using the floating gate electrode 108 as a mask. Subsequently, the exposed surface portion of the p+-type silicon substrate 101 is removed, thereby forming the trench 103 extending into the interior of the silicon substrate 101. It should be noted that the depth of the trench 103 can be arbitrarily determined. As a result of the formation of the trench 103, the n+-type embedded layer 100 is divided into an n+-type drain diffusion layer 102 and an n+-type source diffusion layer 104.

Figure 8E:
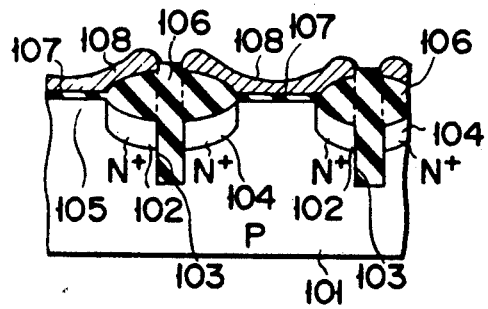

As is shown in FIG. 8E, after the resists 116 are removed, an oxide film is formed on the surfaces of the floating gate electrode 108 and the groove 103 by thermal oxidization process. Then, $SiO_2$ film is deposited on the whole surface by CVD process, and the region inside the trench 103 is etched back and is then filled with SiO₂, so as to return the field oxide film 106 to the original state. As a result, the adjacent memory cells are insulated and isolated from each other by the oxide (SiO₂) introduced into the trench 103.

Figure 8F:
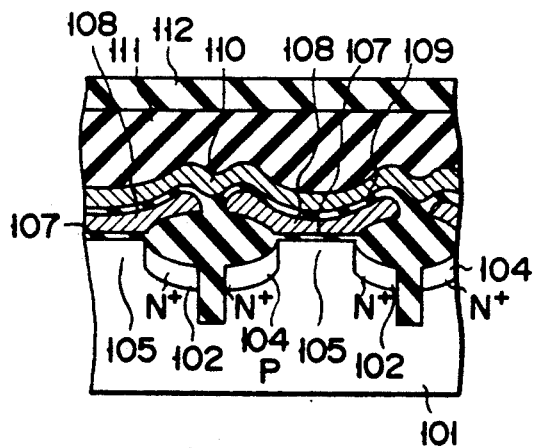

Next, as is shown in FIG. 8F, after the protection oxide films 115 are removed, a second gate insulation layer 109 of stacked layers made of oxide film, nitride film and oxide film is formed on the resultant semiconductor structure. Subsequently, a second polysilicon layer 110 is deposited on the portion above the floating gate electrode 108 until the second polysilicon layer 110 has a predetermined thickness. The second polysilicon layer 110, thus deposited, serves as a control gate electrode. After that, control gate electrodes are patlesued and 1st and 2nd polysilicons are etched to form floating gates and control gates. It should be noted that the floating gate electrode 108 mentioned above is divided by the trench 103 into a plurality of pieces, such that one piece is allotted for each memory cell, whereas the control gate electrode 110 is not divided and is used in common to the memory cells as a word line. Finally, a CVD film 111 is deposited on the resultant semiconductor structure by use of a CVD process, and then a BPSG film 112 serving as an insulation film is deposited on the CVD film 111, so as to flatten the surface of the semiconductor structure. In this manner, the nonvolatile semiconductor device shown in FIGS. 6 and 7 is manufactured.

Figure 1:
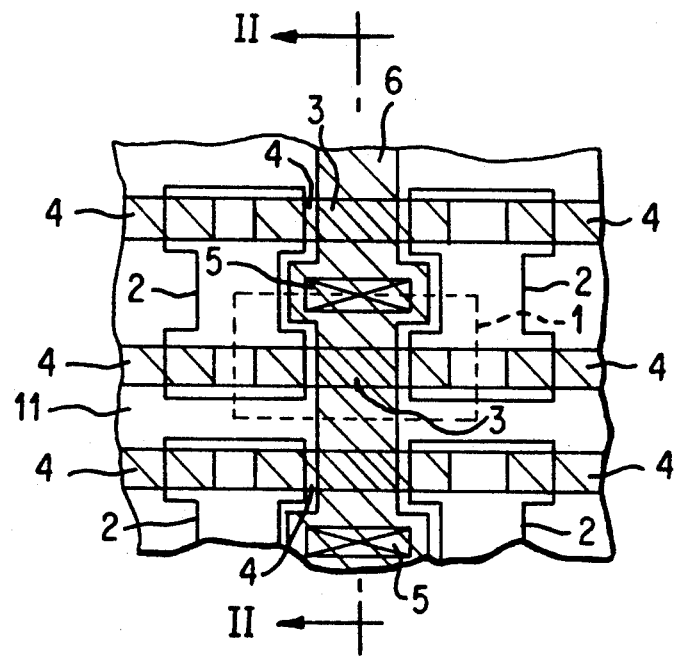
FIG. 1 is a view showing the planar pattern of a conventional EPROM.
Figure 2:
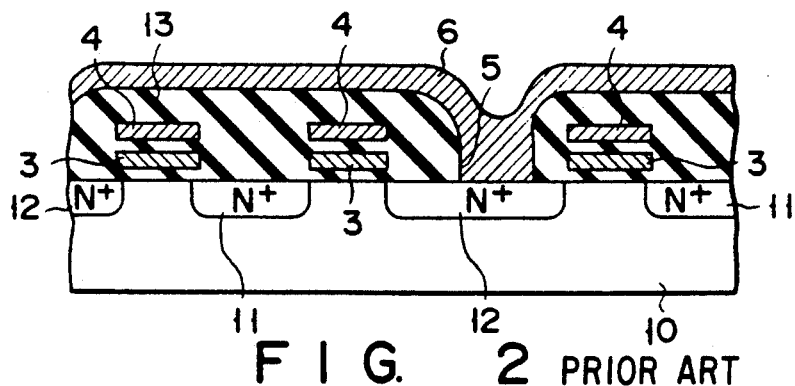
FIG. 2 is a sectional view taken along line II—II in FIG. 1.
Figure 3:
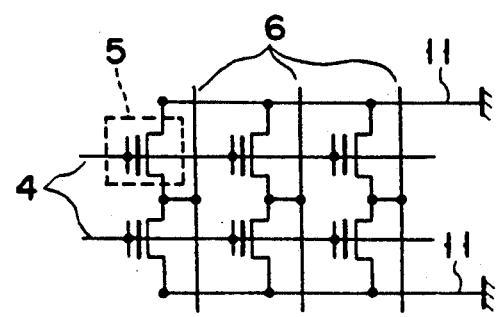
FIG. 3 is a circuit diagram corresponding to the EPROM shown in FIG. 1.
Figure 4:
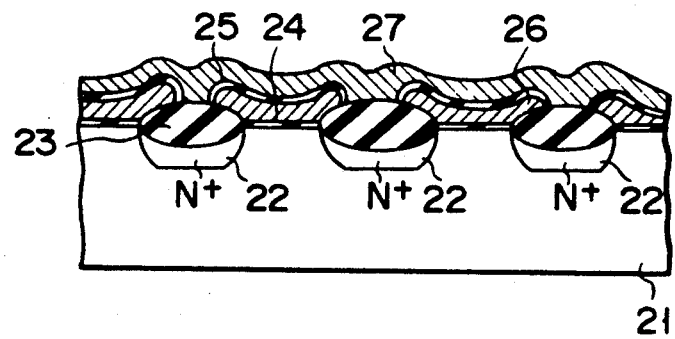
FIG. 4 is a sectional view showing the structure of a conventional contactless EPROM.
Figure 5:
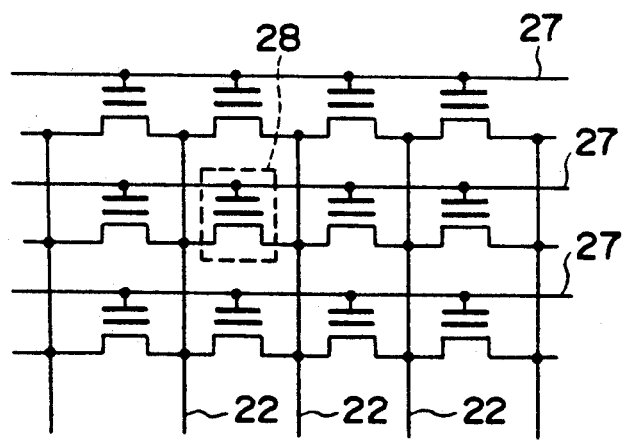
FIG. 5 is a circuit diagram corresponding to the contactless EPROM shown in FIG. 4.

In the EPROM mentioned above, the interval between the adjacent cells is determined by the length of that portion of the floating gate 108 which is projected over the field oxide film 106, i.e., the distance between the adjacent floating gates 108. Thus, the cell array of the EPROM is as small as that of the conventional contactless EPROM shown in FIGS. 4 and 5. Accordingly, it is possible for the present invention to provide a nonvolatile semiconductor device which is of a type wherein one transistor is incorporated in one cell and which can be more miniaturized than the conventional EPROM cell. In addition, since the source diffusion layer 104 and the drain diffusion layer 102 are assigned with their own functions, the present invention can be embodied by using a similar circuit configuration to that of the conventional EPROM. Thus, the peripheral circuits are not complicated, and the selection characteristics of a selection circuit do not become a problem in the present invention.

In the above, the present invention was described, reference to the case where it is applied to an EPROM. However, the present invention is not limited to this, and may be embodied or modified in various manners. For example, the present invention may be applied to a one-time erasable type EEPROM or a mask ROM, as long as they use a double-layered polysilicon structure similar to that of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvalatile semiconductor device made up of a plurality of semiconductor elements in a semiconductor substrate of a first conductivity type, each of the semiconductor elements comprising:
   a source region and a drain region in the semiconductor substrate, the source and drain regions having a second conductivity type, and the source and drain regions defining a channel region in the substrate between the source and drain regions;
   a first gate insulation film on the semiconductor substrate above the channel region and a first gate electrode on the first gate insulation film above the channel region, the first gate electrode being kept in an electrically-floating state;
   a second gate insulation film on the first gate electrode;
   a second gate electrode serving as a control gate, the second gate electrode being on the second gate insulation film;
   a third insulation film on the source and drain regions, the third insulation film being thicker than the first gate insulation film; and
   a trench interposed between the source region of one semiconductor element and the drain region of an adjacent semiconductor element, an edge of the trench being aligned with an end portion of the first gate electrode and the trench being filled with a portion of the third insulation film;
   wherein the third insulation film electrically isolates the channel region of one semiconductor element from the channel region of an adjacent semiconductor element, and wherein the trench electrically isolates the source region of one semiconductor element and the drain region of an adjacent semiconductor element.

2. A nonvolatile semiconductor device according to claim 1, wherein the third insulation film is a field insulation film.

3. A nonvolatile semiconductor device according to claim 1, wherein the control gate is located above the first gate electrode, the third insulation film and the trench, and wherein the control gate electrically connects adjacent semiconductor elements.

4. A nonvolatile semiconductor device according to claim 1, wherein the trench extends from the third insulation film to the interior of the semiconductor substrate.

5. A nonvolatile semiconductor device according to claim 4, wherein the third insulation film is a field insulation film.

6. A nonvolatile semiconductor device according to claim 4, wherein the control gate is located above the first gate electrode, the third insulation film and the trench, and wherein the control gate electrically connects adjacent semiconductor elements.

7. A nonvolatile semiconductor device according to claim 1, wherein the trench is formed by self-aligning end portions of adjacent first gate electrodes.

8. A nonvolatile semiconductor device according to claim 7, wherein the third insulation film is a field insulation film.

9. A nonvolatile semiconductor device according to claim 7, wherein the control gate is located above the first gate electrode, the third insulation film and the trench, and wherein the control gate electrically connects adjacent semiconductor elements.

* * * * *